United States Patent
Thackeray et al.

(10) Patent No.: US 6,800,422 B2
(45) Date of Patent: Oct. 5, 2004

(54) THICK FILM PHOTORESISTS AND METHODS FOR USE THEREOF

(75) Inventors: James W. Thackeray, Braintree, MA (US); James Michael Mori, Boston, MA (US); Gary Ganghui Teng, Northboro, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 145 days.

(21) Appl. No.: 10/142,732

(22) Filed: May 10, 2002

(65) Prior Publication Data

US 2003/0027086 A1 Feb. 6, 2003

Related U.S. Application Data

(60) Provisional application No. 60/290,445, filed on May 11, 2001.

(51) Int. Cl.$^7$ .................................................. G03F 7/26
(52) U.S. Cl. ........................ 430/311; 430/322; 430/330
(58) Field of Search ................................. 430/311, 313, 430/322, 323, 330

(56) References Cited

U.S. PATENT DOCUMENTS

| | | | |
|---|---|---|---|
| 4,978,419 A | | 12/1990 | Nanda et al. ................ 438/701 |
| 5,248,582 A | * | 9/1993 | Uenishi et al. .............. 430/192 |
| 5,302,490 A | | 4/1994 | Fedynyshyn et al. ....... 430/271 |
| 5,861,231 A | | 1/1999 | Barclay et al. ........... 430/270.1 |
| 5,879,856 A | | 3/1999 | Thackeray et al. ....... 430/270.1 |
| 5,882,844 A | | 3/1999 | Tsuchiya et al. ......... 430/288.1 |
| 5,964,951 A | | 10/1999 | Yamamoto et al. .......... 134/1.2 |
| 6,620,576 B2 | * | 9/2003 | Raguin ....................... 430/321 |

* cited by examiner

*Primary Examiner*—Kathleen Duda
(74) *Attorney, Agent, or Firm*—Peter F. Corless; Darryl P. Frickey; Edwards & Angell, LLP

(57) ABSTRACT

New methods and compositions are provided that enable application and processing of photoresist as thick coating layers, e.g. at dried layer (post soft-bake) thicknesses of in excess of 2 microns. Resists can be imaged at short wavelengths in accordance with the invention, including 248 nm.

20 Claims, No Drawings

THICK FILM PHOTORESISTS AND METHODS FOR USE THEREOF

The present application claims the benefit of U.S. provisional application number 60/290,445 filed May 11, 2001, which is incorporated herein by reference in its entirety.

BACKGROUND OF THE INVENTION

1. Field of the Invention

The invention relates to new photoresists, particularly photoresists that can be applied and imaged as thick coating layers. Preferred resists of the invention are chemically-amplified positive-acting resists that contain one or more photoacid generator compounds and a resin component.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4. While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 300 nm or less, or even about 200 nm or less, such as wavelengths of about 248 nm or 193 nm. Use of such short exposure wavelengths can potentially enable formation of smaller features.

It thus would be desirable to have new photoresists and methods for processing photoresists to enable formation of smaller, highly resolved features. It would be particularly desirable to have such photoresists that could be processed at short wavelengths such as sub-300 nm, especially 248 nm.

SUMMARY OF THE INVENTION

We have now found new methods and compositions that enable application and processing of photoresist as thick coating layers, e.g. at dried layer (post soft-bake) thicknesses of in excess of 1 micron, in excess of about 1.5, 2, 3, 4 or even 5 microns.

Resists can be imaged at short wavelengths in accordance with the invention, including 248 nm, to provide highly resolved thick layer relief images. See, for instance, the results set forth in the examples which follow.

In a first aspect, a resist is applied to a substrate as a thick coating layer, e.g. a thickness of from a range of about 1.5 to 5 microns, imaged to patterned activating radiation, and then thermally treated (post-exposure bake or "PEB") at a relatively low temperature, particularly at a temperature that is at least about 10° C., 15° C., 20° C., or 25° C. less than standard post-exposure bake processing of current chemically-amplified positive resists. In particular, in the methods of the invention resists are suitably post-exposure baked at a temperature of about 105° C. or 100° C., more typically about 95° C. or 90° C.

We have surprisingly found that such mild post-exposure bake treatment can provide highly resolved relief images of the thick coating layers upon development. In contrast, the same or comparable resists coated as thinner layers (e.g. 0.5 microns or less) provide relief images of significantly reduced resolution upon such mild PEB treatment.

Also preferred is where the pre-exposure soft-bake (solvent carrier removal) is conducted at a maximum temperature of at least about 15° C. or 20° C. greater than the subsequent post-exposure thermal treatment, more preferably the pre-exposure soft-bake is conducted at a maximum temperature of at least about 25° C. or 30° C. more than the maximum temperature of a subsequent post-exposure thermal treatment. Generally preferred is where is the maximum temperature of the pre-exposure soft-bake is conducted at a temperature of from about 15° C. to 35° C., particularly about 25° C. more than the maximum temperature of the subsequent post-exposure thermal treatment. References herein to a maximum temperature of a thermal treatment (e.g. i) pre-exposure bake or ii) post-exposure, pre-development bake) refers to the maximum temperature reached and retained (e.g. retained for at least about 5, 10 or 15 seconds) during the specified thermal treatment.

In additional aspects of the invention, resist compositions are provided that can facilitate and enhance the deposited thick film coating layer. In particular, resists of the invention may suitably contain a plasticizer compound or composition to promote formation of a thick coating layer.

The resin component also may contain polymers that have a low glass transition temperature, e.g. polymers that have a molecular weight (Mw) of about 30,000 or 20,000 or less, or a molecular weight (Mw) 10,000 or less or 5,000 or less.

The photoacid generator component also may generate relatively large photoacids, e.g. a photoacid having a volume of at least about 155 or 160 $Å^3$, more preferably a volume of at least 170, 180 or 190 $Å^3$. Even larger photoacids will be suitable, including photoacids having a volume of at least about 200, 220, 250, 280 or 300 $Å^3$. Such large photoacids will be less prone to undesired diffusion through a thick resist coating layer.

Particularly preferred photoresists for use in the methods of the invention comprise a polymer having phenolic groups. Even more preferred are photoresists that comprise polymers that have polymerized phenolic units and acrylate units with acid labile groups such as polymerized tert-butyl acrylate, tert-butyl methacrylate, methyladmantyl acrylate, methyladamantyl methacrylate, and the like. Such polymers may be higher order polymers (e.g. terpolymers, tetrapolymers and the like) and contain additional repeat units beyond phenolic units and photoacid-labile alkyl acrylate units. For instance, preferred additional units are relatively inert units such as polymerized styrene or alpha-methylstyrene units. References herein to acrylates are inclusive of substituted acrylates such as methacrylates.

The invention further comprises articles of manufacture comprising substrates such as a microelectronic wafer having coated thereon the photoresists and relief images of the invention. The invention also includes methods to manufacture microelectronic wafers and other articles. Other aspects of the invention are disclosed infra.

DETAILED DESCRIPTION OF THE INVENTION

As discussed above, we have now found new methods and compositions that enable application and processing of photoresists as thick coating layers, e.g. at dried layer (post soft-bake, pre-exposure measurement) thicknesses of in excess of 1 micron, more typically a dried layer thickness in excess of about 1.5, 2, 3, 4, 5 or even 6 microns. Resist layers can be employed that have very significant dried layer thicknesses, although it generally not necessary to apply and process resist layers that are in excess of about 7, 8, 9 or 10 microns.

In the methods of the invention, preferably a temperature differential is employed between a i) pre-exposure thermal treatment of a photoresist composition coating layer where solvent carrier is removed and ii) a post-exposure thermal treatment prior to development. Preferably, the pre-exposure thermal treatment is conducted at a temperature higher than the post-exposure thermal treatment. Preferably, the temperature differential between the maximum pre-exposure treatment temperature and the maximum post-exposure thermal treatment is at least about 5° C., more preferably at least or up to about a 10° C., 15° C., 20° C., 25° C., 30° C. or 40° C. temperature differential. Particularly preferred is where the temperature differential between the maximum pre-exposure thermal treatment temperature and the maximum post-exposure thermal treatment is from 10° C. to 40° C., more preferably a temperature differential of from about 10° C. to 30° C., still more preferably a temperature differential of from about 15° C. to 25° C.

As discussed above, a variety of polymers may be employed as the resin component of a resist of the invention. Preferred resins are phenolic polymers that contain one or more deblocking groups, such as photoacid-labile ester groups or acetal groups. Photoacid-labile ester groups may be suitably provided by polymerization of an alkyl acrylate (which includes substituted acrylates such as methacrylates), such as provided by polymerization of tert-butyl acrylate or tert-butyl methacrylate. Polymerization of other acrylates that have photoacid-labile groups also will be suitable such as a methyladamantyl acrylate and the like.

Preferred phenolic resins that can be employed treated in accordance with the invention include novolak and poly (vinylphenol) resins. Preparation of such phenolic resins is known. Poly(vinylphenols) and phenolic copolymers are generally preferred.

Poly(vinylphenols) may be prepared, e.g., as disclosed in U.S. Pat. No. 4,439,516. Preferred phenolic copolymers are disclosed e.g. in U.S. Pat. Nos. 6,090,526; 6,077,643; 6,057,083; and 5,861,231. Additional suitable polymers are disclosed in and U.S. Pat. Nos. 4,968,581; 4,883,740; 4,810,613; 4,491,628; 5,258,257 and 5,492,793. Poly (vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Copolymers containing phenol and nonaromatic cyclic alcohol units also are preferred resins treated in accordance with the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Acetate groups are preferred acid labile groups to functionalize phenolic OH moieties of a phenolic resin. To provide such groups, a phenolic resin binder precursor may be condensed with a suitable addition compound such as a compound of the formula L—$CR^1R^2C$(=O)—O—$R^3$, where L is a leaving group such as bromide or chloride, $R^1$ and $R^2$ are each independently hydrogen, an electron withdrawing group such as halogen (particularly F, Cl or Br), or substituted or unsubstituted $C_{1-10}$ alkyl; and $R^3$ is substituted or unsubstituted $C_{1-10}$ alkyl, or substituted or unsubstituted aryl such as phenyl or aryalkyl such as benzyl. Condensation of such addition compound provides the groups of the formula —$R^1R^2C$(=O)—O—$R^3$ pendant to the resin binder backbone and grafted onto the resin's available hydroxyl groups. Photoacid degradation of those groups during exposure and/or post-exposure heating provides the polar acetic acid ether moiety pendant to the resin binder backbone. Other preferred acid labile groups pendant to a resin binder backbone include oxycarbonyl groups such as those of the formula —C(=O)O$R^3$ where $R^3$ is as defined above and preferably is t-butyl or benzyl. Such groups are provided by reaction of a resin binder precursor with a suitable addition compound such as a di-alkyl-dicarbonate, e.g. di-t-butyl-dicarbonate. See U.S. Pat. No. 5,258,257 to Sinta et al. and other documents cited therein for discussions of acid labile groups.

Phenolic polymers of resists of the invention also may contain inert blocking groups. Such groups are linked to phenolic OH moieties of a phenolic resin as disclosed in U.S. Pat. No. 5,514,520 to Thackeray et al. As specified in that patent, and referred to herein, an inert blocking group is a group pendant to a resin and that is chemically unreactive in the presence of acid or base generated during exposure and baking of the photoresist composition. Preferred inert blocking groups grafted onto available hydroxyl groups of a resin binder include alkyl (to provide —O—alkyl pendant groups) such as methyl, ethyl, propyl, n-butyl, sec-butyl, t-butyl, etc.; alkanoyl group (to provide RCOO—pendant groups where R is preferably $C_{1-4}$ alkyl); a sulfonyl acid ester such as methanesulfonyl, ethanesulfonyl, propanesulfonyl, benzensulfonyl, toluenesulfonylesters, etc. Such groups may be grafted onto a suitable resin binder precursor such as a phenolic resin by an alkaline or acidic condensation reaction with a suitable addition compound, e.g. reaction of a sulfonic acid halide or other compound with suitable leaving group with a phenolic polymer in the presence of a suitable catalyst such as sodium hydroxide in the case of an alkaline condensation. See also the procedures disclosed in U.S. Pat. No. 5,514,520.

Particularly preferred deblocking resins for use in the resists of the invention include polymers that contain both phenolic and non-phenolic units. For example, one preferred group of such polymers has acid labile groups substantially, essentially or completely only on non-phenolic units of the polymer. One preferred polymer binder has repeating units x and y of the following formula:

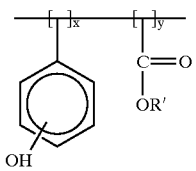

wherein the hydroxyl group be present at either the ortho, meta or para positions throughout the polymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The depicted phenolic units of the polymer also may be optionally substituted by such groups. The units x and y may be regularly alternating in the polymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, of the acrylate units serves as the acid labile groups of the resin and will undergo photoacid induced cleavage upon exposure of a coating layer of a photoresist containing the resin. Preferably the copolymer will have a Mw of from about 3,000 to about 50,000, more preferably about 10,000 to about 30,000 with a molecular weight distribution of about 3 or less, more preferably a molecular weight distribution of about 2 or less. Such copolymers also may be prepared by such free radical polymerization or other known procedures and suitably will have a Mw of from about 3,000 to about 50,000, and a molecular weight distribution of about 3 or less, more preferably a molecular weight distribution of about 2 or less.

Additional preferred deblocking resins have acid labile groups on both phenolic and non-phenolic units of the polymer. One preferred polymer binder has repeating units a, b and c of the following formula:

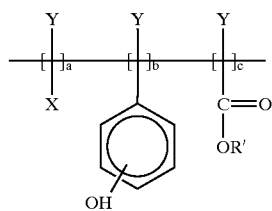

wherein R' group is a photoacid labile group as defined above for the other preferred polymer; X is another repeat unit which may or may not contain a photoacid labile group; and each Y is independently hydrogen or $C_{1-6}$ alkyl, preferably hydrogen or methyl. The values a, b and c designate the molar amount of the polymer units. Those polymer units may be regularly alternating in the polymer, or may be randomly interspersed through the polymer. Suitable X groups may be aliphatic or aromatic groups such as phenyl, cyclohexyl, adamantyl, isobornylacrylate, methacrylate, isobornymethacrylate, and the like. Such polymers may be formed in the same manner as described for the polymer above, and wherein the formed copolymer is reacted to provide the phenolic acid labile groups.

Additional preferred deblocking resins include at least three distinct repeating units of 1) units that contain acid-labile groups; 2) units that are free of reactive groups as well as hydroxy groups; and 3) aromatic or other units that contribute to aqueous developability of a photoresist containing the polymer as a resin binder. Particularly preferred deblocking polymers of this type correspond to the following formula:

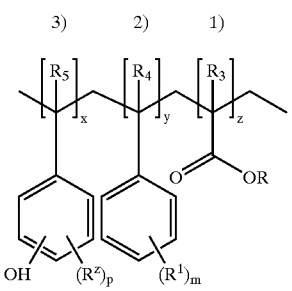

wherein R of units 1) is substituted or unsubstituted alkyl preferably having 1 to about 10 carbon atoms, more typically 1 to about 6 carbons. Branched alkyl such as tert-butyl are generally preferred R groups. Also, the polymer may comprise a mixture of different R groups, e.g., by using a variety of acrylate monomers during the polymer synthesis.

$R^1$ groups of units 2) of the above formula each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkynyl preferably having 2 to about 8 carbons, substituted or unsubstituted alkylthio preferably having 1 to about 8 carbons, cyano, nitro, etc.; and m is an integer of from 0 (where the phenyl ring is fully hydrogen-substituted) to 5, and preferably is 0, 1 or 2. Also, two $R^1$ groups on adjacent carbons may be taken together to form (with ring carbons to which they are attached) one, two or more fused aromatic or alicyclic rings having from 4 to about 8 ring members per ring.

For example, two $R^1$ groups can be taken together to form (together with the depicted phenyl) a naphthyl or acenaphthyl ring. As with units 1), the polymer may comprise a mixture of different units 2) with differing $R^1$ groups or no $R^1$ groups (i.e. m=0) by using a variety of substituted or unsubstituted vinylphenyl monomers during the polymer synthesis.

R2 groups of units 3) of the above formula each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted sulfonyl preferably having 1 to about to about 8 carbon atoms such as mesyl ($CH_3SO_2O$—), substituted or unsubstituted alkyl esters such as those represented by RCOO— where R is preferably an alkyl group preferably having 1 to about 10 carbon atoms, substituted or unsubstituted alkenyl preferably having 2 to about 8 carbons, substituted or unsubstituted alkylthio preferably having 1 to about 8 carbons, cyano, nitro, etc.; and p is an integer of from 0 (where the phenyl ring has a single hydroxy substituent) to 4, and preferably is 0, 1 or 2. Also, two $R^2$ groups on adjacent carbons may be taken together to form (with ring carbons to which they are attached) one, two or more fused aromatic or alicyclic rings having from 4 to about 8 ring members per ring. For example, two $R^2$ groups can be taken together to form (together with the phenol depicted in the above formula) a naphthyl or acenaphthyl ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in the formula above, the hydroxyl group of units 3) may be either at the ortho, meta or para positions throughout the copolymer. Para or meta substitution is generally preferred.

Each $R^3$, $R^4$ and $R^5$ substituent independently may be hydrogen or substituted or unsubstituted alkyl preferably having 1 to about 8 carbon atoms, more typically 1 to about 6 carbons, or more preferably 1 to about 3 carbons.

The above-mentioned substituted groups (i.e. substituted groups R and $R^1$ through $R^5$ of the formula above) may be substituted at one or more available positions by one or more suitable groups such as halogen (particularly F, Cl or Br); $C_{1-8}$ alkyl; $C_{1-8}$ alkoxy; $C_{2-8}$ alkenyl; $C_{2-8}$ alkynyl; aryl such as phenyl; alkanoyl such as a $C_{1-6}$ alkanoyl of acyl and the like; etc.

Typically a substituted moiety is substituted at one, two or three available positions.

In the above formula, x, y and z are the mole fractions or percents of units 3), 2) and 1) respectively in the copolymer. These mole fractions may suitably vary over rather wide values, e.g., x may be suitably from about 10 to 90 percent, more preferably about 20 to 90 percent; y may be suitably from about 1 to 75 percent, more preferably about 2 to 60 percent; and z may be 1 to 75 percent, more preferably about 2 to 60 percent.

Preferred copolymers of the above formula include those where the only polymer units correspond to the general structures of units 1), 2) and 3) above and the sum of the mole percents x, y and z equals one hundred. However, preferred polymers also may comprise additional units wherein the sum of x; y and z would be less than one hundred, although preferably those units 1), 2) and 3) would still constitute a major portion of the copolymer, e.g. where the sum of x, y and z would be at least about 50 percent (i.e. at least 50 molar percent of the polymer consists of units 1), 2) and 3)), more preferably the sum of x, y and z is at least 70 percent, and still more preferably the sum of x, y and z is at least 80 or 90 percent. See European Published Patent Application EP 0813113A1 for detailed disclosure of free radical synthesis of copolymers of the above Formula 1.

Other resin systems may be employed in a photoresist employed in accordance with the invention. For instance, resins can be employed that contain repeat units that comprise an acetal or ketal moiety that will react with photogenerated acid, and optionally aromatic repeat units such as phenyl or phenolic groups, such as polymers as described in U.S. Pat. Nos. 5,929,176 and 6,090,526, both incorporated herein by reference.

The resin component may be present as a sole resin component, or as a component of a blend of resins. The resin component of a resist composition of the invention should be present in an amount sufficient to providing acceptable film-forming characteristics. See the example which follows for preferred amounts of a resin component.

As discussed above, photoacid generators are preferred photoactive components. The term photoacid generator compound as used herein is not inclusive of the diazonaphoquinone photoactive compounds used at relatively higher wavelengths such as 365 nm and where a deblocking reaction of resin or other resist component does not occur.

Particularly preferred PAGs for use in resists of the invention include include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones and disulfonehydrazines, nitrobenzyl compounds, halogenated particularly fluorinated non-ionic PAGS.

More specifically, preferred iodonium PAGs include those of the following Formula 1:

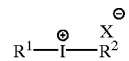

I wherein in Formula I, $R^1$ and $R^2$ are each independently optionally substituted alkyl such as $C_{1-20}$alkyl including alicyclics such as cyclohexyl, adamantly, isobornyl, norbornyl, fencyl, dodecanyl, and the like; optionally substituted carbocyclic aryl such as phenyl, naphthyl and the like; and optionally substituted heteroaromatic or heteroalicyclic such as groups having 1 to 3 separate or fused rings and 1-3 hetero atoms (N, O, or S) as ring members; and X is a counter anion such as a carboxylate or sulfonate counter anion, preferably a a sulfonate (—SO₃) or carboxylate(—COO⁻) substituted with one or more moieties such as optionally substituted alkyl preferably $C_{1-20}$alkyl, particularly $C_{1-10}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocyclic aryl such as phenyl or naphthyl; optionally substituted heteroaromatic or heteroalicyclic such as groups having 1 to 3 separate or fused rings and 1-3 hetero atoms (N, O or S) as ring members.

Preferred imidosulfonate PAGs include compounds of the following Formula II:

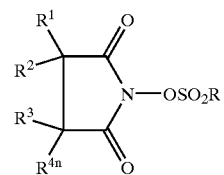

II wherein in Formula II, R is suitably by optionally substituted alkyl preferably $C_{1-20}$alkyl, particularly $C_{1-10}$alkyl substituted with one or more electron-withdrawing groups e.g. F or other halo, nitro, cyano, etc., with pertluoruoalkyl, particularly $C_{1-10}$perfluoroalkyl being preferred; optionally substituted carbocyclic aryl such as phenyl or naphthyl; optionally substituted heteroaromatic or heteroalicyclic such as groups having 1 to 3 separate or fused rings and 1-3 hetero atoms (N, O or S) as ring members;

$R^1$, $R^2$, $R^3$ and $R^4$ each independently being hydrogen or a group as defined for R, or where $R^2$ and $R^3$ are taken together and/or $R^1$ and $R^4$ are taken together to form a ring, preferably an alicyclic ring, e.g. having from 4 to about 8 ring members; and n is 1, 2; 3 or 4, preferably 1 or 2.

Preferred PAGs of Formula II include those with a fused alicyclic ring structure, such as PAGs of the following Formula IIa:

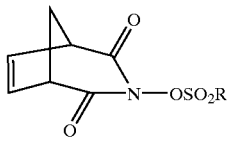

IIa wherein in Formula IIa, R is the same as defined in Formula II above, and preferably R is fluorinated $C_{1-12}$alkyl, particularly perfluoro$C_{1-12}$alkyl such as —$CF_3$.

Sulfonium PAGS also will be suitable for use in resists of the invention, although perhaps less preferred than the iodonium salts and imidosulfonate compounds. For instance, preferred sulfonium PAGs include compounds of the following Formula III:

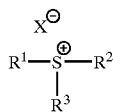

III wherein $R^1$, $R^2$ and $R^3$ are each independently selected from the same group as defined for $R^1$ and $R^2$ in Formula I above; and X is the same as defined for Formula I above.

Also preferred are ring sulfonium PAGs such as those of the following Formula IV:

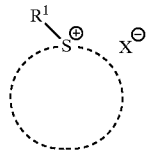

IV wherein $R^1$ and X are the same as defined in Formula III above; the dotted lines designate a ring structure that includes the depicted sulfur cation as a ring member, the ring suitably having 5 to about 8 ring members, and one, two or more endocyclic multiple bonds, and one or more optional ring substituents. Preferably the dotted lines form a non-aromatic ring, such as thienyl, or a completely saturated ring (no endocyclic double bonds).

In the above Formulae I, III and IV, preferred counter anions X are perfluoroalkyl and perfluoroalkoxy groups such as $C_{1-15}$perfluoroalkyl and $C_{1-15}$perfluoroalkoxy, e.g. triflate, perfluorobutanesulfonate, perfluorohexanesulfonate, perfluoroctanesulfonate, and perfluoroethoxyethylsulfonate.

A variety of other PAGs may be used in resists of the invention, including non-ionic PAGs such as substituted disulfone compounds; sulfonate compounds including N-oxyimino sulfonate compounds, -cyano N-oxyimino sulfonate compounds; sidulfone hydrazine compounds; diazomethanedisulfone compounds; nitrobenzyl compounds; substituted acylsulfonium compounds; and oxime sulfonate compounds including bis-N-oxyimidosulfonate compounds.

More particularly, preferred disulfone PAGs for use in resists of the invention include compounds of the following Formula V:

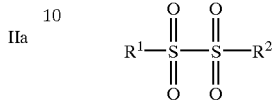

V wherein $R^1$ and $R^2$ are the same as defined for Formula I above.

Preferred oxime sulfonate PAGs for use in resists of the invention include those of the following Formula VI:

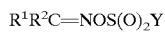

VI wherein $R^1$ and $R^2$ may be the same as defined above for Formula I, and/or where at least one of $R^1$ and $R^2$ is an electron-withdrawing moiety such as cyano, nitro, haloalkyl particularly $C_{1-12}$haloalkyl especially $C_{1-12}$perfluoroalkyl such as —$CF_3$, —$CF_2CF_3$ and other perfluoroalkyl, alkanoyl, and the like;

Y is a non-hydrogen substituent and is suitably the same as defined for R in Formula II above.

Preferred diazosulfone PAGS for use in resists of the invention include those of the following Formula VII:

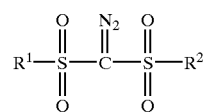

VII wherein $R^1$ and $R^2$ are the same as defined in Formula I above.

Preferred α,α-methylenedisulfone PAGs for use in resists of the invention include those of the following Formula VIII:

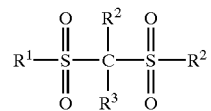

VIII wherein $R^1$ and $R^2$ are the same or different and are other than hydrogen and are suitably the same as defined above in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

As mentioned above, disulfonehydrazine PAGS (i.e. hydrazine moiety interposed between the two sulfone moieties) also are suitable, preferably where the hydrazine moiety (e.g. N($R^3$)—N($R^4$)— of Formula IX below) interposed between the two sulfone moieties is mono- or di-substituted with non-hydrogen substituents. Preferred disulfonehydrazine PAGS for use in resits of the invention include compounds of the following Formula IX:

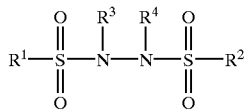

IX wherein R$^1$ and R$^Z$ are the same or different and are other than hydrogen, and suitably are the same as defined in Formula I;

R$^3$ and R$^4$ are the same or different and may be hydrogen or a non-hydrogen substituent such as defined for R$^1$ in Formula I above, and preferably at least one of R$^3$ and R$^4$ is other than hydrogen, more preferably both R$^3$ and R$^4$ are other than hydrogen.

Further suitable PAGs for use in resists of the invention include disulfonylamine (i.e. —SO$_2$—N—SO$_2$—) salts, such as compounds of the following Formula X:

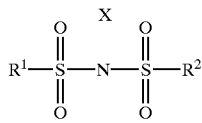

X wherein R$^1$ and R$^2$ are the same or different and are other than hydrogen, and suitably are the same as defined in Formula 1; and X is a counter ion.

One or more PAGS should be employed in a resist in an amount sufficient to provide a developable image upon exposure to activating radiation, such as 248 nm radiation. Suitably one or more PAGs are employed in an amount of 1 to 15 weight percent based on total solids of the resist (i.e. all components except solvent), more typically about 2 to 12 weight percent of total solids.

PAGs for use in resists of the invention can be made by generally known procedures. For instance, see U.S. Pat. Nos. 4,442,197 and 4,642,912 and European Application 0708368A1 for synthesis of iodonium PAGs. See WO 94/10608 for synthesis of N-sulfonyloxyimide PAGs. Diazosulfone PAGs can be made, e.g., by procedures disclosed in European Patent Application 0708368A1 and U.S. Pat. No. 5,558,976. See also WO 00/10056.

As discussed above, preferred PAGs of the invention generate relatively large photoacids to inhibit undesired diffusion of the photoacid into unexposed of the thick resist layer. For example, preferred photoacids may have a volume of at least about 155 or 160 Å$^3$, more preferably a volume of at least 170, 180 or 190 Å$^3$. Even larger photoacids will be suitable, including photoacids having a volume of at least about 200, 220, 250, 280 or 300 Å$^3$. Such large photoacids will be less prone to undesired diffusion through a thick resist coating layer.

References herein to sizes of photoacids designate volumetric size as determined by standard computer modeling, which provides optimized chemical bond lengths and angles. A preferred computer program for determining photoacid size is Alchemy 2000, available from Tripos. For a further discussion of computer-based determination of photoacid size, see T. Omte et al., Polymers for Advanced Technologies, "Photoreactive Fluorinated Polyimide Protected by a Tetrahydropyranyl Group Based on Photoinduced Acidolysis", volume 4, pages 277–287.

Exemplary preferred large photoacids include the following, with volumetric size values (Å$^3$) listed immediately below the acid.

185 Å$^3$ $CF_3(CF_2)_7SO_3H$

244 Å$^3$

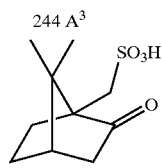

193 Å$^3$ $CF_3(CF_2)_5SO_3H$

208 Å$^3$

It also should be appreciated that preferred resists of the invention are distinguished from resists that contain a so-called photoactive compound (PAC) rather than a photoacid generator. Typical PACs are diazonaphthoquinones and function as dissolution inhibitors rather than an acid that promotes a deblocking reaction. Such PAC-containing resists are imaged with radiation of relatively long wavelengths such as I-line (365 nm).

As discussed above, resists of the invention also may contain one or more plasticizer materials, which can promote formation of a thick resist layer. Preferred plasticizers for use in resists of the invention include e.g. materials having one or more hetero atoms (particularly S or O), and preferably materials having a molecular weight of about 20 to 1000, more typically about 20 to about 50, 60, 70, 80, 90; 100, 150, 200, 250, 300, 400 or 500, e.g. adipates, sebacates and phthalates such as bis(2-butoxyethyl)adipate; bis(2-butoxyethyl)sebacate; bis-(2-butoxyethyl)phthalate; 2-buyoxyethyl oleate; diisodecyl adipate; diisodecyl glutarate; and poly(ethylene glycols) such as poly(ethyleneglycol)acrylate, poly(ethylene glycol)bis(2-ethylhexanoate), poly(ethylene glycol)dibenzoate, poly(ethylene glycol)dioleate, poly(ethylene glycol)monooleate, tri(ethylene glycol)bis(2-ethylhexanoate), and the like.

One or more plasticizer compounds may be suitably present in a resist composition in an amount of from about 0.5 to 10 or more weight percent based on total solids (all components except solvent), more preferably 0.5 to 3 weight percent of total solids of a resist.

As discussed, various moieties of resin units, PAGS, plasticizers and other components of resists of the invention may be optionally substituted, typically 1, 2, or 3 positions by one or more suitable groups such as e.g. halogen (particularly F, Cl or Br); C$_{1-8}$ alkyl; C$_{1-8}$ alkoxy; C$_{2-8}$ alkenyl; C$_2$-8 alkynyl; hydroxyl; alkanoyl such as a C$_{1-6}$ alkanoyl e.g. acyl; carbocyclic aryl such as phenyl; and the like, although multiple carbon-carbon bonds and aromatic groups will be less preferred due to excessive absorbance of exposure radiation.

Preferred substituent groups of substituted groups of resins, PAGs, plasticizers, and other components of resists of the invention include or consist of at least one halogen atom, preferably fluorine such as fluorinated C$_{1-12}$alkyl, perfluoroC$_{1-12}$alkyl, and perfluoroC$_{1-12}$alkylene, fluorinated C$_{3-8}$cycloalkyi, and fluorinated ethers (including C$_{1-12}$ alkoxy) and esters (including $C_{1-12}$ esters) including fluorinated cyclic ethers and fluorinated cyclic esters.

As used herein, the term alkyl, alkynyl and alkynyl unless otherwise modified refers to both cyclic groups, although of course cyclic groups will comprise at least three carbon ring members. Alkoxy groups of resist components suitably have 1 to about 16 carbons and 1, 2, 3 or 4 alkoxy linkages. Suitable alkanoyl groups have 1 to about 16 carbons and one or more carbonyl groups, typically 1, 2 or 3 carbonyl groups. Carbocyclic aryl as used herein refers to non-hetero aromatic groups that have 1 to 3 separate or fused rings and 6 to about 18 carbon ring members and may include phenyl, naphthyl, biphenyl, acenaphthyl, phenanthracyl and the like. Phenyl and naphthyl are often preferred. Suitable heteroaromatic or heteroaryl groups will have 1 to 3 rings, 3 to 8 ring members in each ring and from 1 to about 3 hetero atoms (N, O or S). Specifically suitable heteroaromatic or heteroaryl groups include e.g. courmarinyl, quinolinyl, pyridyl, pyrimidinyl, furyl, pyrrolyl, thienyl, thiazolyl, oxazolyl, imidazolyl, indolyl, benzofuranyl and benzothiazole.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate; 2-heptanone and cyclohexanone. Typically, the solids content of the. composition varies between about 5 and 35 percent by weight of the total weight of the photoresist composition. The resin binder and, photoactive components should be present in amounts sufficient to provide a film coating layer and formation of good quality latent and relief images. See the example which follows for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

The resists and methods of the invention are particularly use in e.g. the manufacture of thin film heads (e.g. 3 to 5 $\mu$m), magnetic disks, CD masks, and back-end implants.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent-upon the exposure tool and the components of the photoresist composition.

As discussed above, coating layers of the resist compositions of the invention are preferably photoactivated by a short exposure wavelength, particularly a sub-300 and sub-200 nm such as 248 nm, 193 nm and 157 nm. 248 nm imaging is particularly preferred.

Following exposure, the film layer of the composition is preferably baked under relatively mild conditions, particularly a post-exposure bake not exceeding about 110° C., more preferably not exceeding about 105° C., 100° C., 95° C. or 90° C.

The post-exposure bake also is relatively short in duration, e.g. the imaged coating is heated under such mild conditions for no more than about 3 minutes, more preferably no more than about 2, 1.5, 1, 0.75 or 0.5 minutes.

After the post-exposure bake, the resist layer may be developed to provide a relief image, e.g. by treating the coating layer with an aqueous alkaline solution such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. Plasma development also may be employed. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting example is illustrative of the invention.

EXAMPLE 1
Resist Preparation and Processing with Comparative Results

A resist (referred to below as "Resist 1") was prepared by admixing the following components where amounts are expressed as weight percent of total weight of the resist.

| Component | Amount |
|---|---|
| Resin. | 26.830 |
| PAG | 0.537 |
| Basic Additive | 0.034 |
| Leveling agent | 0.027 |
| Ethyl lactate solvent | 72.573 |

In Resist 1, the resin is a polyhdroxystyrene-tert-butylacrylate copolymer; the PAG is a di-(4-t-butylphenyl) iodonium-trifluoromethylbenzenesulfonate; the basic additive is tetrabutylammonium lactate; the leveling agent is FC-430 (available from 3M). As shown above, Resist 1 was formulated at 27.4 percent solids.

The formulated Resist 1 was filtered through a 0.2 micrometer Teflon filter and spin coated onto 6 inch silicon wafers (pre-treated with hexamethylenedisiloxane at 120° C. for 30 seconds) on a TEL Mark 8 track (from Tokyo Electron Limited) to a thickness of about 3.0 micrometer (3000 angstroms) and baked at 130° C. for 60 seconds. The coated wafers were exposed on an GCA XLS 7800 deep UV stepper equipped with a KrF laser (248 nm) for a lines/ spaces test pattern using 0.53 NA and 0.74 σ stepper settings, followed by post exposure bake at 100° C. (130° C. for comparison samples) for 90 seconds and development with an aqueous alkaline developer (CD-26 available from the Shipley Company).

A sample of the same Resist 1 (this processed resist sample referred to herein as Comparative Processed Resist 1) was then processed in the same manner as described immediately above, except the higher (130° C.) post-exposure bake was employed for the Comparative Processed Resist 1.

The Resist 1 and Comparative Processed Resist 1 were imaged and developed for 600 nm 1:1 lines/spaces and 800 nm trenches. Resist 1 processed at the lower PEB (110° C.) showed excellent resist relief image profiles, while the Comparative Processed Resist 1 processed at conventional, higher PEB (130° C.) showed very poor relief image profiles.

The foregoing description of the invention is merely illustrative thereof, and it is understood that variations and modifications can be effected without departing from the spirit or scope of the invention as set forth in the following claims.

What is claimed is:

1. A method for producing an electronic article, the method comprising:
   applying a liquid coating layer of a positive-acting photoresist on a substrate surface, the photoresist comprising one or more photoacid generator compounds and a resin having photoacid-labile groups;
   by thermal treatment removing solvent from the photoresist coating layer to provide a photoresist layer thickness of at least about 1.5 microns;
   exposing the photoresist coating layer to patterned activating radiation;
   heating the exposed photoresist layer at a temperature lower than the temperature of the thermal treatment to remove solvent; and
   developing the photoresist coating layer to provide a resist relief image;
   wherein the temperature differential of the maximum temperature of the thermal treatment prior to exposure and the heating after exposure is from about 10° C. to about 40° C.

2. The method of claim 1 wherein the temperature differential is from about 10° C. to about 30° C.

3. The method of claim 1 wherein the photoresist comprises a resin that comprises phenolic units.

4. The method of claim 1 wherein the photoresist comprises a resin that comprises phenolic units and photoacid-labile acrylate units.

5. The method of claim 1 wherein the electronic article is a microelectronic wafer.

6. The method of claim 1 wherein solvent is removed to provide a resist layer thickness of at least about 3 microns.

7. The method of claim 1 wherein the photoresist coating layer is exposed to radiation having a wavelength of about 248 nm.

8. A method for producing an electronic article, the method comprising:
   applying a liquid coating layer of a positive-acting photoresist on a substrate surface, the photoresist comprising one or more photoacid generator compounds and a resin having photoacid-labile groups;
   by thermal treatment removing solvent from the photoresist coating layer to provide a photoresist layer thickness of at least about 3 microns;
   exposing the photoresist coating layer to patterned activating radiation;
   heating the exposed photoresist layer at a temperature lower than the temperature of the thermal treatment to remove solvent;
   and thereafter,
   developing the photoresist coating layer to provide a resist relief image.

9. The method of claim 8 wherein the temperature differential of the maximum temperature of the thermal treatment prior to exposure and the heating after exposure is at least about 10° C.

10. The method of claim 8 wherein the photoresist comprises a resin that comprises phenolic units.

11. The method of claim 8 wherein the photoresist comprises a resin that comprises phenolic units and photoacid-labile acrylate units.

12. The method of claim 8 wherein the electronic article is a microelectronic wafer.

13. The method of claim 8 wherein the photoresist coating layer is exposed to radiation having a wavelength of about 248 nm.

14. A method for producing an electronic article, the method comprising:
   applying a liquid coating layer of a positive-acting photoresist on a substrate surface, the photoresist comprising a photoacid generator compound and a resin having photoacid-labile groups;
   removing solvent from the photoresist coating layer to provide a photoresist layer thickness of at least about 3 microns;
   exposing the photoresist coating layer to patterned activating radiation;
   heating the exposed photoresist layer to a temperature not exceeding about 110° C.;
   and thereafter,
   developing the photoresist coating layer to provide a resist relief image.

15. The method of claim 14 wherein the exposed photoresist layer is heated to a temperature not exceeding about 100° C. prior to developing the photoresist coating layer.

16. The method of claim 14 wherein the photoresist comprises a resin that comprises phenolic units.

17. The method of claim 14 wherein the photoresist comprises a resin that comprises phenolic units and photoacid-labile acrylate units.

18. The method of claim 14 wherein the electronic article is a microelectronic wafer.

19. The method of claim 14 wherein solvent is removed to provide a resist layer thickness of at least about 5 microns.

20. The method of claim 14 wherein the photoresist coating layer is exposed to radiation having a wavelength of about 248 nm.

* * * * *